United States Patent [19]

Sawazaki

[11] 4,189,738
[45] Feb. 19, 1980

[54] SEMICONDUCTOR INTEGRATED CIRCUIT DEVICE

[75] Inventor: Hajime Sawazaki, Tokyo, Japan

[73] Assignee: Tokyo Shibaura Electric Co., Ltd., Japan

[21] Appl. No.: 946,632

[22] Filed: Sep. 28, 1978

Related U.S. Application Data

[63] Continuation of Ser. No. 778,598, Mar. 17, 1977, abandoned.

[30] Foreign Application Priority Data

Mar. 18, 1976 [JP] Japan .................................. 51-29662

[51] Int. Cl.² .......................................... H01L 27/02
[52] U.S. Cl. ...................................... 357/40; 357/34; 357/44; 357/51; 330/268; 330/272
[58] Field of Search .................. 357/34, 40, 44, 51; 330/268, 272

[56] References Cited

U.S. PATENT DOCUMENTS

| 3,961,340 | 6/1976 | Encinas | 357/44 |
| 3,986,199 | 10/1976 | Williams | 357/44 |

Primary Examiner—Edward J. Wojciechowicz
Attorney, Agent, or Firm—Finnegan, Henderson, Farabow & Garrett

[57] ABSTRACT

There is provided a semiconductor integrated circuit device having a Class B push-pull circuit including a first transistor of which the base is connected with a signal source and the collector to a positive power source, and a second transistor of which the collector is connected with the emitter of the first transistor, the base to the signal source, and the emitter to ground. The first transistor has a large area of safe operation compared with the second transistor.

3 Claims, 8 Drawing Figures

SEMICONDUCTOR INTEGRATED CIRCUIT DEVICE

This is a continuation of application Ser. No. 778,598, filed Mar. 17, 1977, now abandoned.

BACKGROUND OF THE INVENTION

The present invention relates to a semiconductor integrated circuit device and more particularly to that including a Class B push-pull circuit.

In the prior art, a Class B push-pull circuit using two power output transistors TR1 and TR2 as shown in FIG. 1 is well known. The collector-emitter paths of the transistors TR1 and TR2 are connected in series between a power source Vcc and the ground. The base of the transistor TR1 is connected through a resistor R1 with the emitter of a driver transistor TR3 of which the base is coupled with a signal input and the collector is coupled with the power source Vcc. The base of the transistor TR2 is coupled through a resistor R2 with the collector of a driver transistor TR4 of which the emitter is coupled with the collector of the transistor TR2 and the base is coupled with the signal input terminal 1. Diodes D1 and D2 are used to compensate for the variation in operation characteristics due to temperature change of the transistors TR3 and TR4.

The collector of the transistor TR2 is connected through a resistor R3 to the emitter of the power transistor TR1 and grounded through a coupling capacitor C and a load resistor R0. The emitter of the power transistor TR2 is grounded through a resistor R4. The output signal is produced from an output terminal 2 coupled with the collector of the transistor TR2.

When a power switch (not shown) is turned on and the power source Vcc is electrically coupled with the push-pull circuit, current for charging the coupling capacitor C flows through the collector-emitter path of the power transistor TR1. FIG. 2 shows the relation of the current Ic flowing into the transistor TR1 and the voltage $V_{CE}$ across the collector-emitter path of the transistor TR1. In the figure, a point A indicates the current Ic and the voltage $V_{CE}$ of the transistor TR1 at the stationary state, when no signal is supplied thereto. In the worst condition, the voltage Vcc is directly applied to the transistor TR1 and thus a large current flows therethrough, resulting possibly in destruction of the transistor TR1. On the other hand, the transistor TR2 does not operate until the capacitor C is completely charged. For this, the transistor TR2 will operate in the load operation mode. Accordingly, the transistor TR2 is hard to be destroyed compared with the transistor TR1. In the integrated circuit, a high voltage power source is used so that there is a high possibility that the transistor TR1 is destroyed. Particularly in bipolar transistors, the area of safe operation where the transistor is safely operable is smaller as the operation voltage increases. Therefore, the transistor TR1 used under such an unfavorable condition is more apt to be destroyed.

SUMMARY OF THE INVENTION

An object of this invention is to provide a semiconductor integrated circuit device in which the area of safe operation of that one of the two power output transistors constituting a Class B push-pull circuit which is connected to a power source is enlarged, thereby to eliminate the above-mentioned disadvantage.

In one preferred form of the invention, the semiconductor integrated circuit device comprises a Class B push-pull circuit including a power source terminal, a ground terminal, and the first and second power output transistors of which the emitter-collector paths are connected in series between the power source terminal and the ground terminal and the bases are connected to receive an input signal, wherein the transistor connected with the power source terminal is formed to have a larger area of safe operation than the other transistor.

Other objects and features of the present invention will be apparent from the following description taken in connection with the accompanying drawings, in which:

BRIEF DESCRIPTION OF THE DRAWING

FIG. 2 is a graphic chart illustrating the relation of the collector current and the voltage across the collector-emitter path of a transsistor TR1 used in the push-pull circuit of FIG. 1, when the power is switched on;

DESCRIPTION OF THE PREFERRED EMBODIMENTS

Preferred embodiments of the present invention will be described with reference to the accompanying drawings.

Figure 3:
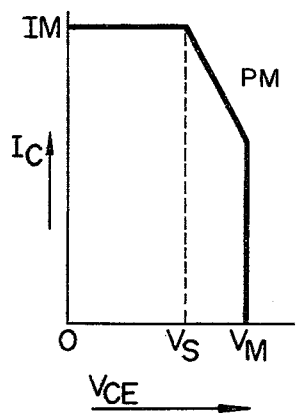
FIG. 3 is a graphic chart of the relation of the collector current and the voltage between the collector and emitter for illustrating the destructive withstandingness or the area of safe operation of a transistor.

The term "area of safe operation" used in this specification means the power area where the transistor used can be safely operated. As shown in FIG. 3, the area of safe operation is the area enclosed by the maximum permissible current $I_M$ of the collector current Ic and the maximum permissible voltage $V_M$ of the voltage $V_{CE}$. It is to be noted that this chart shows that, when the collector voltage $V_{CE}$ exceeds a predetermined value Vs, the permissible current is restricted below the maximum value $I_M$, and hence the transistor is more easily destroyed in this region.

Figure 1:
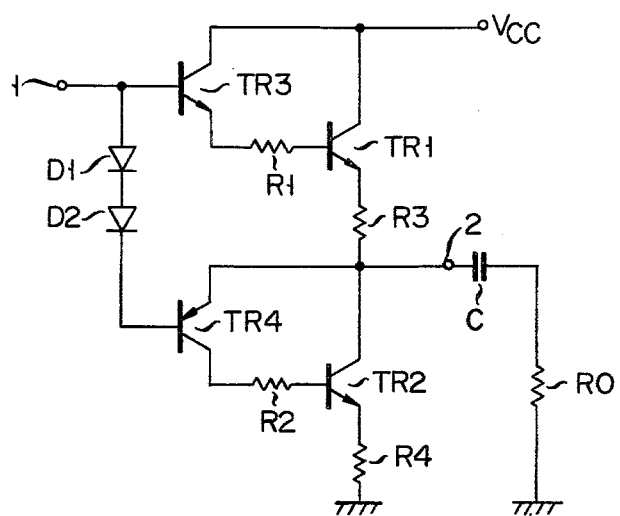
FIG. 1 shows a circuit diagram of a conventional push-pull circuit.
Figure 2:
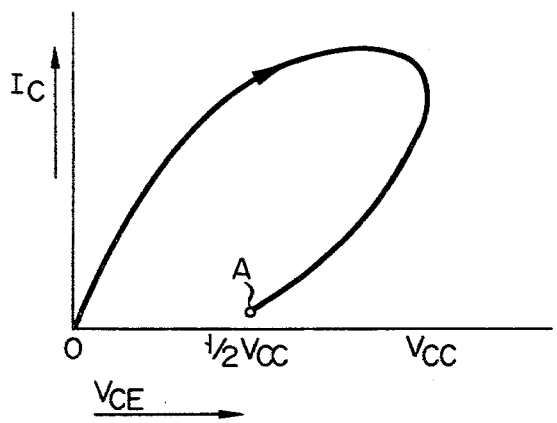
Figure 4:
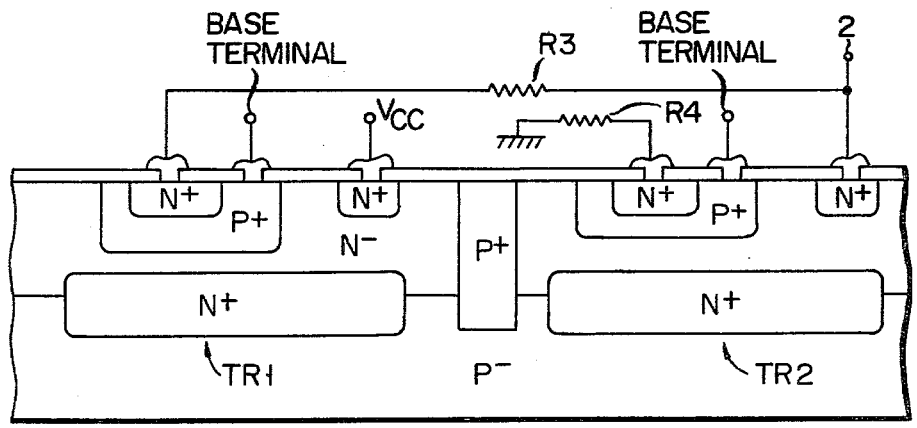
FIGS. 4 to 8 show embodiments of a semiconductor integrated circuit device according to the present invention.

FIG. 4 schematically illustrates a semiconductor integrated circuit device for explaining an embodiment of the present invention. The semiconductor integrated circuit in the figure corresponds to the circuit including the transistors TR1 and TR2 and, the resistor R3 of the semiconductor integrated circuit shown in FIG. 1. In this device, the base width of the transistor TR1 is formed thicker than that of the transistor TR2. For this, minority carriers injected into the base of the transistor TR1 widely disperse until they reach the collector region and hence the current density of the current flowing through the emitter-collector path of the transistor is reduced. This means that the destructive withstandingness of the transistor TR1 is strengthened than that of the transistor TR2.

Figure 5:
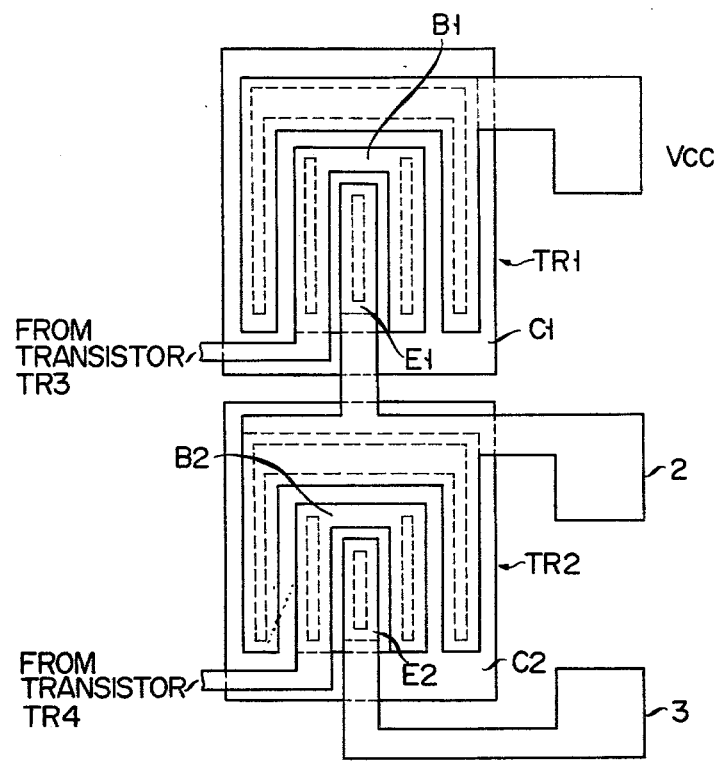

FIG. 5 shows a plan view of the semiconductor integrated circuit of another embodiment of the present invention. In this device, a terminal 3 connected with the emitter of the transistor TR2 is used as a ground terminal. The regions enclosed by dotted broken lines in the emitter regions E1 and E2, base regions B1 and B2 and the collector regions C1 and C2 of the transistors TR1 are the contact regions of the emitter, base and collector regions of the respective transistors.

In this embodiment, the emitter of the transistor TR1 has a larger area than that of the transistor TR2. Thus, the emitter current density of the transistor TR1 is lower than that of the transistor TR2 so that the destructive withstandingness of the transistor TR1 is strengthened than that of the transistor TR2.

Figure 6:
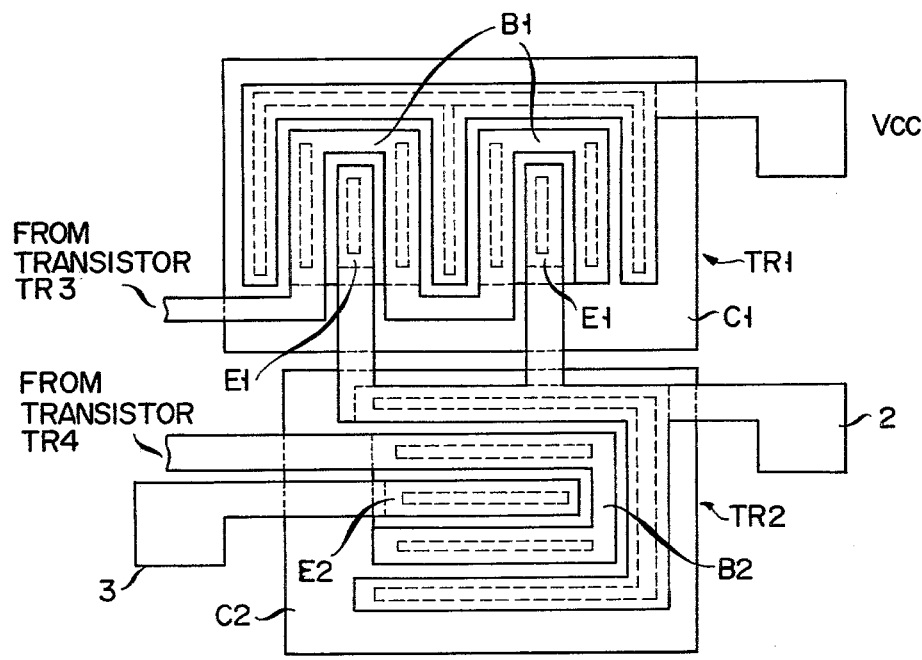

Another embodiment of the present invention will be shown in FIG. 6. In this embodiment, the emitter and base regions of the transistor TR1 are each divided into two sections. In this way, the emitter and base regions are divided without changing the emitter area and thus the heat radiation effect of the transistor TR1 is improved. As a result, the destructive withstandingness of the transistor TR1 is enhanced in comparison with the transistor TR2.

Figure 7:
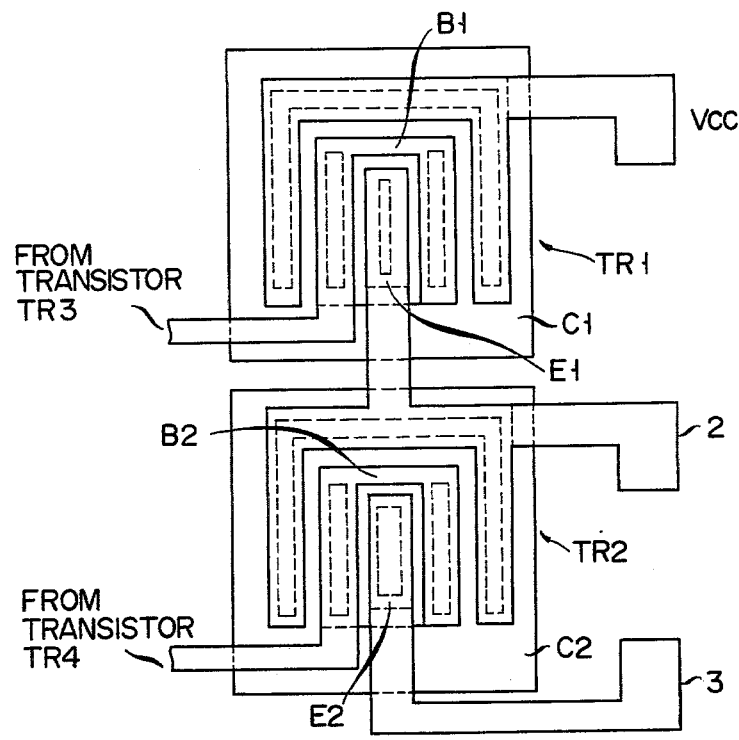

FIG. 7 shows a still further embodiment of the semiconductor integrated circuit of the present invention. In this embodiment, the width of the contact region for the emitter of the transistor TR1 is formed smaller than that of the transistor TR2. With this construction, the emitter resistor R3 of the transistor TR1 has a larger resistance than the emitter resistor R4 of the transistor TR2. For this, the voltage drop across the emitter resistor R3 becomes larger than that of emitter resistor R4 with the result that the transistor TR1 has a greater destructive withstandingness than the transistor TR2.

Figure 8:
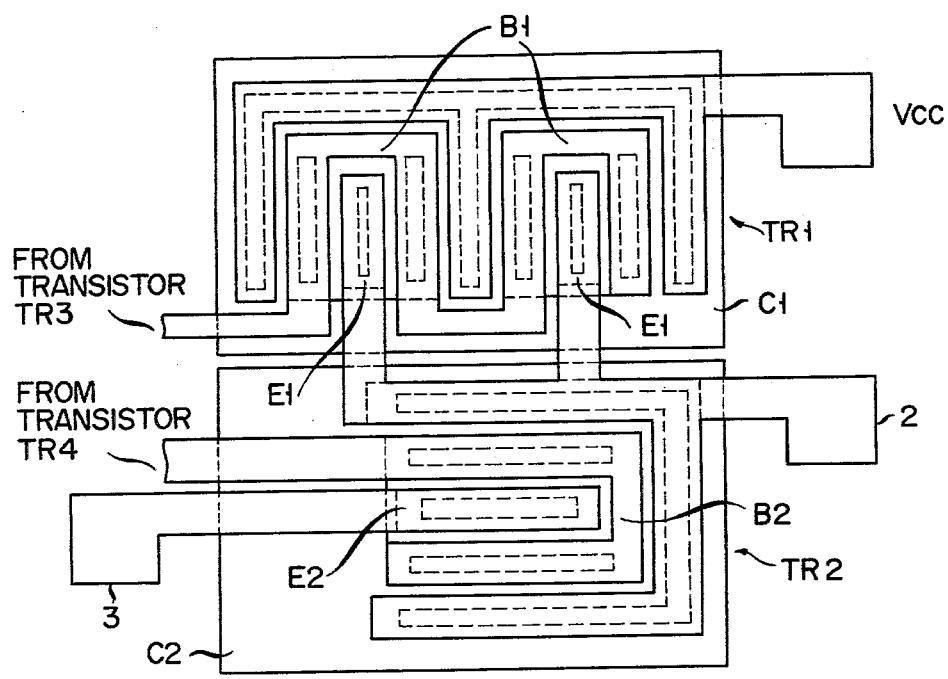

In the embodiment of the semiconductor integrated circuit shown in FIG. 8, the emitter of the transistor TR1 is divided into two sections, and the contact region to the emitter of the transistor TR1 is formed narrower than that of the transistor TR2. With this division, the individual divided emitter resistors function in the same manner as the emitter resistors shown in FIG. 7, and hence the destructive withstandingness of the transistor TR1 is enhanced.

It will be understood that the present invention is not limited to the embodiments heretofore described. For example, in the FIG. 1 circuit, if the base resistor R1 of the transistor TR1 is made larger than the base resistor R2 of the transistor TR2, the bias voltage to the base-emitter path of the transistor TR1 is restricted and hence the destructive withstandingness of the transistor may be improved.

Various other modifications of the disclosed embodiments will become apparent to person skilled in the art without departing form the spirit and scope of the invention as defined by the appended claims.

What is claimed is:

1. A semiconductor integrated circuit device comprising:
a Class B push-pull circuit having first and second terminals for connection across a source of power, the second terminal being a ground connection, and first and second power output transistors of the same conductivity type having, respectively, first and second emitter-collector paths successively connected in series between said first and second terminals and first and second bases connected to receive an input signal, said first transistor whose emitter-collector path is connected to said first terminal being formed to have a greater maximum permissible dissipation power compared with said second transistor whose emitter-collector path is connected to said second terminal.

2. A semiconductor integrated circuit device comprising:
a Class B push-pull circuit having first and second terminals for connection across a source of power, the seond terminal being a ground connection, and first and second power output transistors of the same conductivity type having, respectively, first and second emitter-collector paths successively connected in series between said first and second terminals, first and second bases connected to receive an input signal, and first and second emitter resistors, said first transistor whose emitter-collector path is connected to said first terminal having an emitter resistor formed to have a greater resistance than the emitter resistor of said second transistor whose emitter-collector path is connected to the second terminal.

3. A semiconductor integrated circuit according to claim 2, wherein said first transistor and second transistor further comprise first and second base resistors, respectively, the first base transistor being formed to have a greater base resistance than said second base resistor.

* * * * *